United States Patent
Suenaga et al.

(10) Patent No.: US 9,293,688 B2
(45) Date of Patent: Mar. 22, 2016

(54) PIEZOELECTRIC ELEMENT AND PIEZOELECTRIC DEVICE

(71) Applicant: Hitachi Cable, Ltd., Tokyo (JP)

(72) Inventors: Kazufumi Suenaga, Tsuchiura (JP); Kenji Shibata, Tsukuba (JP); Kazutoshi Watanabe, Tsuchiura (JP); Akira Nomoto, Kasumigaura (JP); Fumimasa Horikiri, Nagareyama (JP)

(73) Assignee: SCIOCS COMPANY LIMITED, Hitachi-Shi, Ibaraki-Ken (JP)

( * ) Notice: Subject to any disclaimer, the term of this patent is extended or adjusted under 35 U.S.C. 154(b) by 427 days.

(21) Appl. No.: 13/746,860

(22) Filed: Jan. 22, 2013

(65) Prior Publication Data

US 2013/0187516 A1    Jul. 25, 2013

(30) Foreign Application Priority Data

Jan. 23, 2012  (JP) .................................. 2012-011373

(51) Int. Cl.
*H01L 41/09* (2006.01)
*H01L 41/18* (2006.01)
(Continued)

(52) U.S. Cl.
CPC .................. *H01L 41/18* (2013.01); *H01G 5/18* (2013.01); *H01L 41/0477* (2013.01); *H01L 41/0805* (2013.01); *H01L 41/1873* (2013.01); *H01L 41/316* (2013.01)

(58) Field of Classification Search
CPC .................................. G01B 3/12; C04B 35/01
USPC ...... 310/358; 501/134; 252/62, 9 PZ, 62.9 R; 257/347
See application file for complete search history.

(56) References Cited

U.S. PATENT DOCUMENTS 6,347,862 B1    2/2002  Kanno et al.
6,494,567 B2 *  12/2002 Murai .............................. 347/71
(Continued)

FOREIGN PATENT DOCUMENTS

JP    61-185809 A    8/1986
JP    10-286953 A    10/1998
(Continued)

OTHER PUBLICATIONS

"High Performance piezoelectric material and advancing applied technology", supervising editor: Kiyoshi Nakamura, published by Science and Technology, 2007, with partial English translation.
(Continued)

*Primary Examiner* — Thomas Dougherty
(74) *Attorney, Agent, or Firm* — McGinn IP Law, PLLC.

(57) ABSTRACT

A piezoelectric element includes a substrate, and at least a lower electrode layer, a piezoelectric film represented by a general formula of $(Na_xK_yLi_z)NbO_3$ ($0 \leq x \leq 1$, $0 \leq y \leq 1$, $0 \leq z \leq 0.2$, $x+y+z=1$); and an upper electrode layer successively formed on the substrate. The piezoelectric film has a crystal structure of pseudo-cubic crystal, tetragonal crystal, orthorhombic crystal, monoclinic crystal or rhombohedral crystal, or has a state that at least two of the crystal structures coexist. The piezoelectric film is preferentially oriented to certain specific axes that are not more than two axes of crystal axes in the crystal structures. At least one of domain crystal component of a c-axis orientation domain crystal component and an a-axis orientation domain crystal component exists as the components of the crystal axes oriented.

19 Claims, 6 Drawing Sheets

(51) Int. Cl.
*H01L 41/047* (2006.01)
*H01G 5/18* (2006.01)
*H01L 41/08* (2006.01)
*H01L 41/187* (2006.01)
*H01L 41/316* (2013.01)

(56) References Cited

U.S. PATENT DOCUMENTS

| | | | | |
|---|---|---|---|---|
| 6,817,073 | B2 * | 11/2004 | Uchiyama et al. | 29/25.35 |
| 7,323,806 | B2 * | 1/2008 | Shibata et al. | 310/358 |
| 7,701,121 | B2 * | 4/2010 | Oka et al. | 310/358 |
| 8,310,135 | B2 * | 11/2012 | Suenaga et al. | 310/358 |
| 8,310,136 | B2 * | 11/2012 | Suenaga et al. | 310/358 |
| 8,581,477 | B2 * | 11/2013 | Suenaga et al. | 310/358 |
| 8,860,286 | B2 * | 10/2014 | Suenaga et al. | 310/358 |
| 8,896,187 | B2 * | 11/2014 | Suenaga et al. | 310/358 |
| 2004/0051763 | A1 | 3/2004 | Matsubara et al. | |
| 2007/0278904 | A1 * | 12/2007 | Shibata et al. | 310/358 |
| 2009/0121588 | A1 * | 5/2009 | Yamaguchi et al. | 310/358 |
| 2010/0320874 | A1 | 12/2010 | Suenaga et al. | |

FOREIGN PATENT DOCUMENTS

| | | | | |
|---|---|---|---|---|
| JP | 2002-164586 A | | 6/2002 | |
| JP | 2004-128492 A | | 4/2004 | |
| JP | 2007-19302 A | | 1/2007 | |
| JP | 2007-317853 | * | 12/2007 | H01L 41/187 |
| JP | 2007-317853 A | * | 12/2007 | H01L 41/187 |
| JP | 2008-004781 A | | 1/2008 | |
| JP | 2008-263132 A | * | 10/2008 | H01L 41/09 |
| JP | 2008-305916 A | * | 12/2008 | H01L 41/09 |
| JP | 2010-135669 A | * | 6/2010 | H01L 41/09 |
| JP | 2011-030195 A | | 2/2011 | |
| JP | 2011-181764 A | | 9/2011 | |

OTHER PUBLICATIONS

Japanese Office Action dated Mar. 17, 2015 with English Translation.

* cited by examiner

● :Na, K
● :Nb
○ :O

PIEZOELECTRIC ELEMENT AND PIEZOELECTRIC DEVICE

The present application is based on Japanese patent application No. 2012-011373 filed on Jan. 23, 2012, the entire contents of which are incorporated herein by reference.

BACKGROUND OF THE INVENTION

1. Field of the Invention

This invention relates to a piezoelectric element configured such that a piezoelectric property is improved by controlling crystal orientation of a piezoelectric film using lithium potassium sodium niobate and a piezoelectric device.

2. Description of the Related Art

A piezoelectric material is processed so as to form various piezoelectric elements in accordance with a variety of the intended uses, in particular, is widely used as a functional electronic component such as an actuator that allows an object to be changed in shape when an electric voltage is applied thereto, a sensor that generates an electric voltage due to the change in shape of the element reversely.

As the piezoelectric material that is used for the application of the actuator and the sensor, a lead-based dielectric material that has an excellent piezoelectric property, in particular, a $Pb(Zr_{1-X}Ti_X)O_3$ based perovskite type dielectric material that is referred to as a PZT has been widely used, normally the PZT dielectric material is formed by sintering an oxide comprised of an individual element.

In addition, recently, in terms of environmental consideration, it is desired that a piezoelectric material that is lead-free is developed, and it is in progress to develop lithium potassium sodium niobate represented by a general formula of $(Na_xK_yLi_z)NbO_3$ (0<x<1, 0<y<1, 0<z<1, x+y+z=1) or the like. The lithium potassium sodium niobate has a piezoelectric property comparable to the PZT, thus the niobate is expected as a strong candidate of a lead-free piezoelectric material.

On the other hand, at present, various electronic components become more downsized and upgraded, thus it is strongly needed for the piezoelectric element to be downsized and upgraded. However, a piezoelectric material manufactured by a conventional manufacturing method such as a sintering method, particularly if it has a thickness of not more than 10 μm, is configured to have a thickness that is close to the size of the crystal grain constituting the material, thus the influence thereof cannot be ignored. Consequently, a problem is caused that variation and deterioration in the property become prominent, thus in recent years, for the purpose of preventing the problem, a forming method of a piezoelectric film in which a thin film technology and the like are applied instead of the sintering method has been investigated.

Recently, a PZT thin film formed on a silicon substrate by a RF sputtering method is put into practical use as an actuator for a head of a high-definition and high-speed ink-jet printer (for example, refer to JP-H10-286953 A1 and "High performance piezoelectric material and advancing applied technology" supervising editor: Kiyoshi Nakamura, published by Science & Technology, 2007).

In addition, a piezoelectric film that is represented by a general formula of $(Na_xK_yLi_z)NbO_3$ and has a high orientation in a particular plane direction is also proposed as a piezoelectric element of lithium potassium sodium niobate that is lead-free (for example, refer to JP-A-2007-019302). According to JP-A-2007-019302, for example, the piezoelectric film formed by a sputtering method can be lead-free and obtain an excellent piezoelectric property.

SUMMARY OF THE INVENTION

A lead-free piezoelectric film is formed as a piezoelectric film, thereby a printer head of a high-definition and high-speed ink-jet printer and a downsized and low-cost gyro sensor that are reduced in an environment load can be fabricated. As the particular candidate, a basic research of thinned lithium potassium sodium niobate is currently underway. For the cost reduction in the application area, it is essential that a technique for forming the piezoelectric film on a Si substrate or a glass substrate in a well-controlled state is established. In case of fabricating an actuator or a sensor by using the Si substrate, conventionally, in a lead-free based piezoelectric film corresponding to a basic portion of the piezoelectric element, domain crystal components (c-axis and a-axis orientation domain crystal components) of crystallite preferentially oriented along each crystal axis are not be controlled, thus it is difficult to stably manufacture a lead-free based device that has a long life and a high piezoelectric constant.

In the element, the component ratio between the c-axis and a-axis orientation domain crystal components of the crystallite is different depending on portions, thus the piezoelectric constant and voltage dependence thereof of the piezoelectric film formed on the substrate become inhomogeneous, so as to be one of the causes of the lowering of production yield.

Accordingly, it is an object of the invention to provide a piezoelectric element that has an excellent piezoelectric property and a high reliability, as well as a piezoelectric device using the piezoelectric film.

(1) According to one embodiment of the invention, a piezoelectric element comprising:

a substrate; and at least a lower electrode layer; a piezoelectric film represented by a general formula of $(Na_xK_yLi_z)NbO_3$ (0≤x≤1, 0≤y≤1, 0≤z≤0.2, x+y+z=1); and an upper electrode layer successively formed on the substrate, wherein the piezoelectric film has a crystal structure of pseudo-cubic crystal, tetragonal crystal, orthorhombic crystal, monoclinic crystal or rhombohedral crystal, or has a state that at least two of the crystal structures coexist, the piezoelectric film is preferentially oriented to certain specific axes that are not more than two axes of crystal axes in the crystal structures, and at least one of domain crystal component of a c-axis orientation domain crystal component and an a-axis orientation domain crystal component exists as the components of the crystal axes oriented.

In the above embodiment (1) of the invention, the following modifications and changes can be made.

(i) A quantitative relationship between the c-axis orientation domain crystal component and the a-axis orientation domain crystal component as the components of the oriented crystal axes of the piezoelectric film is configured such that, if the total component ratios of both of the components are defined as 100%, the component ratio of the c-axis orientation domain crystal component falls within the range of 10 to 90%, and the component ratio of the a-axis orientation domain crystal component falls within the range of 90 to 10%.

(ii) The piezoelectric film has an aggregate structure comprised of particles having a columnar structure.

(iii) The piezoelectric film has a composition of crystal or amorphia represented by a general formula of $ABO_3$, or the mixture of the crystal and the amorphia in at least a part thereof, where A represents at least one element selected from the group consisting of Li, Na, K, Pb, La, Sr, Nd, Ba and Bi, B represents at least one element selected from the group consisting of Zr, Ti, Mn, Mg, Nb, Sn, Sb, Ta and In, and O represents oxygen.

(iv) The lower electrode layer is an electrode layer comprising Pt or an alloy containing Pt as a main component, or an electrode layer having a multilayer structure including a layer comprising Pt as a main component.

(v) The lower electrode layer is an electrode layer having a multilayer structure including a layer comprising at least one element selected from the group consisting of Ru, Ir, Sn and In, the oxide of the elements or a compound between elements contained in the piezoelectric film and the elements of Ru, Ir, Sn and In.

(vi) The upper electrode layer is an electrode layer comprising Pt or an alloy containing Pt as a main component, or an electrode layer having a multilayer structure including a layer comprising Pt as a main component.

(vii) The upper electrode layer is an electrode layer having a multilayer structure including a layer comprising at least one element selected from the group consisting of Ru, Ir, Sn and In, the oxide of the elements or a compound between elements contained in the piezoelectric film and the elements of Ru, Ir, Sn and In.

(viii) The lower electrode layer is an electrode layer that is formed of a single layer or a multilayer structure, and is preferentially oriented in a direction perpendicular to the surface of the substrate in the crystal orientation.

(ix) The substrate comprises crystal or amorphia of Si, MgO, ZnO, $SrTiO_3$, $SrRuO_3$, glass, quartz glass, GaAs, GaN, sapphire, Ge or stainless, or a composite thereof.

(2) According to another embodiment of the invention, a piezoelectric device comprises:

the piezoelectric element according to the above embodiment (1); and a voltage applying device or a voltage detecting device connected between the lower electrode layer and the upper electrode layer of the piezoelectric element.

The invention is invented such that, in order to solve the above problems, the component materials for the piezoelectric film, the electrode layers, the substrate and the adhesion layer as components are properly selected, the manufacturing conditions of the materials are optimized, and the domain crystal component ratio of the piezoelectric film (thus obtained and preferentially oriented) oriented along each crystal axis is accurately measured, so that the domain crystal component ratio of each axis orientation of the piezoelectric film can be intentionally controlled so as to freely control the piezoelectric property demanded by the specific use. Thus, a piezoelectric film can be provided that exhibits any piezoelectric property depending on the use of the various piezoelectric elements such as a sensor requiring a high piezoelectric constant at low voltage and an actuator requiring a large piezoelectric displacement amount from low voltage to high voltage.

Effects of the Invention

According to one embodiment of the invention, a piezoelectric element can be provided that has an excellent piezoelectric property and a high reliability, as well as a piezoelectric device using the piezoelectric film.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Hereinafter, the piezoelectric element according to the embodiment of the invention.

Structure of Piezoelectric Element

Figure 1:
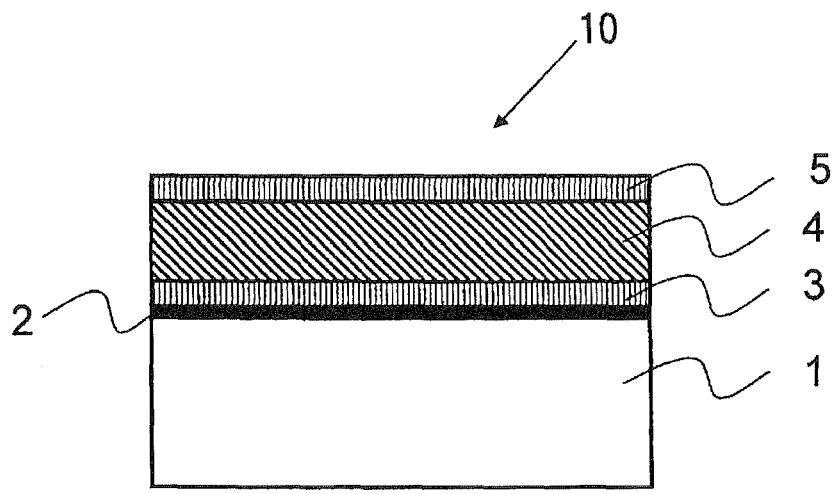
FIG. 1 is a cross-sectional view schematically showing a piezoelectric element according to Example of the invention.

As shown in FIG. 1, the piezoelectric element 10 includes substrate 1 and an adhesion layer 2 formed on the surface of the substrate 1, a lower electrode layer 3 formed on the adhesion layer 2, a piezoelectric film 4 on the lower electrode layer 3 and an upper electrode layer 5 formed on the piezoelectric film 4, and the piezoelectric film 4 is comprised of a perovskite type alkali niobate represented by a general formula of $(Na_xK_yLi_z)NbO_3$ ($0 \leq x \leq 1$, $0 \leq y \leq 1$, $0 \leq z \leq 0.2$, $x+y+z=1$). In addition, the piezoelectric element 10 is configured such that the lower electrode layer 3 is formed so as to be oriented in a predetermined direction and the piezoelectric film 4 is formed so as to be preferentially oriented in a predetermined direction to the lower electrode layer 3.

Substrate

As a material of the substrate 1, for example, crystal or amorphia of Si, MgO, ZnO, $SrTiO_3$, $SrRuO_3$, glass, quartz glass, GaAs, GaN, sapphire, Ge or stainless, or a composite thereof can be used. Above all, a Si substrate that is low cost and is industrially proven is preferably used. Further, it is preferable that if the Si substrate is used, an oxide film is formed on the surface of the Si substrate.

As the substrate 1, it is preferred to select a substrate that is capable of strictly controlling the orientation domain crystal component ratio by comparing the crystal orientation of the lithium potassium sodium niobate film in details, with regard to the piezoelectric element in which the adhesion layer, the lower electrode layer and the lithium potassium sodium niobate film as the piezoelectric film that are afterward formed are formed.

As the oxide film (not shown) formed on the surface of the substrate 1, a thermally-oxidized film formed by a thermal oxidization, a Si oxide film formed by a chemical vapor deposition (CVD) method and the like can be used. Further, the lower electrode layer such as a Pt electrode can be directly formed on the oxide substrate such as a quartz glass substrate, a MgO substrate, a $SrTiO_3$ substrate, a $SrRuO_3$ substrate without forming the oxide film.

Lower Electrode Layer

The lower electrode layer 3 is formed on the substrate 1 via the adhesion layer 2. The lower electrode layer 3 is an important layer for allowing the piezoelectric film 4 to be formed, for example, and is formed by a sputtering method or a deposition method. It is preferable that the lower electrode layer 3 is preferentially oriented in a (111) plane direction. The lower electrode layer 3 preferentially oriented in the (111) plane direction (a direction perpendicular to the surface of the substrate 1) becomes a polycrystal having a columnar structure, so that the piezoelectric film 4 formed on the lower electrode layer 3 can be preferentially oriented in a specific plane direction.

It is preferable that the lower electrode 3 is an electrode layer that is comprised of Pt or an alloy containing Pt as a main component, or an electrode layer having a multilayer structure including a layer comprised of Pt as a main component. In addition, it is preferable that lower electrode layer 3 is formed so as to be oriented in the (111) plane direction, and it can be also adopted that the adhesion layer 2 configured to heighten an adhesion to the substrate 1 is formed between the substrate 1 and the lower electrode layer 3 comprised of Pt or the alloy containing Pt as a main component.

Piezoelectric Film

The piezoelectric film 4 is comprised of a perovskite type alkali oxide represented by a general formula of $(Na_xK_yLi_z)NbO_3$ ($0 \leq x \leq 1$, $0 \leq y \leq 1$, $0 \leq z \leq 0.2$, $x+y+z=1$) as a main phase. For example, the piezoelectric film 4 can be configured such that the potassium sodium niobate or the lithium potassium sodium niobate is doped with a predetermined amount of Cu, Ta, V or the like.

The film formation of the piezoelectric film 4 is carried out by using a RF sputtering method, an ion beam sputtering method, a CVD method or the like.

Measurement and Control of Film Formation Orientation

Conventionally, with regard to crystal orientation of the lithium potassium sodium niobate film (including the potassium sodium niobate film), detail analysis thereof and accurate control based on the analysis do not have been carried out. Namely, hitherto it has been left unclear whether the crystal orientation of the piezoelectric film is in a state of a random orientation, or in a state that only certain one axis is preferentially oriented in a direction perpendicular to the substrate, or in a state that specific axes of not less than two are preferentially oriented at what ratio, or the like.

Namely, with regard to the crystal orientation that is one of property determining factors of the piezoelectric film, the piezoelectric film has been manufactured without carrying out quantification for finding a slight change, thus a desired piezoelectric property according to the required performance of the device could not be obtained with high reproducibility. Actually, with regard to the lithium potassium sodium niobate film that is in a state of the (001) preferential orientation, the piezoelectric property thereof may be differentiated depending on a film formation place or a manufacturing lot.

The reason is as follows. Conventionally, although it can be confirmed by a simple X-ray diffraction method referred to as a $2\theta/\theta$ scan generally known that the crystal orientation is approximately in a state of the (001) preferential orientation, it is impossible to carry out a detail analysis without finding out a small change of the (001) or (100) orientation of the piezoelectric film. As a result, it is difficult to grow the crystal by strictly carrying out the control of the (001) plane crystal orientation and the (100) plane crystal orientation. In order to enhance throughput of quality control, measurement due to a high speed scan is essential, but in case of using a X-ray detector having a low resolution or a X-ray source having a weak intensity, it is difficult to separately measure the respective X-ray diffraction spectrums corresponding to the (001) plane crystal orientation and the (100) plane crystal orientation, thus the crystal state of the orientation domain along each crystal axis cannot be clarified.

Then, a new study about the conventional X-ray diffraction is advanced, and the optimization of measurement condition is carried out by using a two-dimensional X-ray detector having a high resolution and a strong intensity micro part X-ray source, so that the structure of the piezoelectric film according to the preferred embodiment of the invention has been strictly specified.

The X-ray analysis apparatus includes, for example, an X-ray diffraction device with high power X-ray generator in which a two-dimensional detector having a large area X-ray detection region is mounted, the device being manufactured by BRUKER AXS and sold by the trade name of D8 DISCOVER with HI STAR (registered trade mark). Further, with regard to the orientation condition of the polycrystal, refer to the following reference literatures in which the details thereof are described.

Reference literature 1: "Handbook of X-ray diffraction", edited by Rigaku Corporation, the revised fourth edition, published by Rigaku Corporation, 1986

Reference literature 2: "New edition Elements of X-ray diffraction" wrote by Cullity, published by Agne-sHoFu corn, 1980

Crystal Orientation of Piezoelectric Film

The piezoelectric film 4 has a crystal structure of pseudo-cubic crystal, tetragonal crystal, orthorhombic crystal, monoclinic crystal or rhombohedral crystal, or has a state that at least two of the crystal structures coexist. It is preferable that the piezoelectric film 4 has a crystal structure of pseudo-cubic crystal, tetragonal crystal, or orthorhombic crystal, or has a state that at least one of the crystal structures coexists. In addition, the piezoelectric film 4 is preferentially oriented to certain specific axes that are not more than two axes of crystal axes in the crystal structures, and at least one of domain crystal component of the c-axis orientation domain crystal component and the a-axis orientation domain crystal component exists as the components of the crystal axes oriented. In the invention, domain crystal components (the c-axis and a-axis orientation domain crystal components) of crystallite preferentially oriented along each crystal axis are quantified, and are accurately controlled and supervised, thereby the required piezoelectric property can be enhanced.

It is preferable that a quantitative relationship between the c-axis orientation domain crystal component and the a-axis orientation domain crystal component as the components of the oriented crystal axes of the piezoelectric film is configured such that, if the total component ratios of both of the components are defined as 100%, the component ratio of the c-axis orientation domain crystal component falls within the range of 10 to 90%, and the component ratio of the a-axis orientation domain crystal component falls within the range of 90 to 10%.

The piezoelectric property of the piezoelectric element 10 manufactured is varied depending on which domain component is larger in the component ratio, thus by controlling the domain component ratio of the crystal axes of the piezoelectric film in accordance with application use, the required property can be enhanced.

In case that the total component ratios of the a-axis and c-axis orientation domain crystal components are defined as 100%, and the component ratios of the both axes fall within the above-mentioned range, if the c-axis orientation domain crystal component is larger than the a-axis orientation domain crystal component in the component ratio, there is a tendency that an amount of voltage change of the piezoelectric constant is reduced. Namely, it means that variation width of piezoelectric property due to increase and decrease of voltage can be prevented, and in case of applying to a product for which increase of the piezoelectric constant in a low voltage is required, the required property can be achieved by manufacturing it while controlling the crystal orientation such that the c-axis orientation domain crystal component ratio occupies most of the both axes component ratios.

In addition, in case that the component ratios of the both axes fall within the above-mentioned range, if the a-axis orientation domain crystal component is larger than the c-axis orientation domain crystal component in the component ratio, there is a tendency that voltage dependence of the piezoelectric constant is increased. Namely, it means that variation width of piezoelectric property to voltage is large, and in case of applying to a product for which control of piezoelectric displacement amount according to largeness of applied voltage is required, the required property can be achieved by manufacturing it while controlling the crystal orientation such that the a-axis orientation domain crystal component ratio occupies most of the both axes component ratios.

In the invention, the orientation of the piezoelectric film is accurately measured and the film formation is carried out in the optimum condition described below, and the crystal orientation of the piezoelectric film is stably controlled, thereby the piezoelectric element and the piezoelectric device manufactured is configured such that enhancement of piezoelectric property and stabilization are realized, and a micro device having a high performance can be provided at a low cost.

Manufacturing Method of Piezoelectric Element

Next, a manufacturing method of the piezoelectric element 10 according to the embodiment will be explained based on FIG. 1. Hereinafter, a manufacturing method of the piezoelectric element 10 including the piezoelectric film 4 according to the embodiment will be explained.

The manufacturing method of the piezoelectric element 10 according to the embodiment includes a step of forming the lower electrode layer 3 on the substrate 1 via the adhesion layer 2, a step of forming the piezoelectric film 4 on the lower electrode layer 3, the piezoelectric film 4 comprised of a perovskite type alkali niobate represented by a general formula of $(Na_xK_yLi_z)NbO_3$ ($0 \leq x \leq 1$, $0 \leq y \leq 1$, $0 \leq z \leq 0.2$, $x+y+z=1$) and having a crystal structure of pseudo-cubic crystal, tetragonal crystal, orthorhombic crystal, monoclinic crystal or rhombohedral crystal, or has a state that at least one of the crystal structures coexists, and a step of forming the upper electrode layer 5 on the piezoelectric film 4.

First, the lower electrode layer 3 that is preferentially oriented in the (111) plane direction is formed on the substrate 1 via the adhesion layer 2. It is preferable that the lower electrode layer 3 is an electrode layer comprising Pt or an alloy containing Pt as a main component, or an electrode layer having a multilayer structure including the electrode layer comprising Pt as a main component. Or, it is preferable that the lower electrode layer 3 is an electrode layer comprising Pd or an alloy containing Pd as a main component, or an electrode layer having a multilayer structure including the layer comprising Pd or an alloy containing Pd as a main component. The optimum condition of the film formation at this time will be explained below.

Next, the piezoelectric film 4 is formed on the lower electrode layer 3 by using a target having a predetermined composition ratio and a magnetron sputtering method. As the film forming method of the piezoelectric film 4, a sol-gel method, a hydrothermal synthesis method, an ion-beam sputtering method, a CVD method, an Aerosol Deposition (AD) method and the like other than a sputtering method can be used.

Subsequently, the upper electrode layer 5 is formed on the piezoelectric film 4. Further, the upper electrode layer 5 is formed similarly to the lower electrode layer 3.

Optimum Condition of Film Formation

The piezoelectric element is manufactured as mentioned above, but in order to obtain a piezoelectric element having an excellent piezoelectric property, it is necessary to manufacture after optimizing the film formation condition. The optimum condition will be explained below.

First, with regard to the substrate 1, a substrate that is capable of strictly controlling the orientation domain crystal component ratio of the lithium potassium sodium niobate film is selected, and the adhesion layer 2, the lower electrode layer 3, the piezoelectric film 4 and the upper electrode layer 5 are sequentially formed in the upper part thereof.

In order to form the piezoelectric film 4 with high reproducibility, it is necessary to stably realize a crystal property of the lower electrode layer 3 (the Pt film) that is an initial crystal growth surface of the piezoelectric film 4, thus the optimization of the film formation condition such as a film formation temperature, a film formation gas, a degree of vacuum is carried out, and the crystal orientation of the lithium potassium sodium niobate film is strictly controlled and supervised by using an evaluation method of the orientation domain based on the above-mentioned X-ray diffraction method optimized.

As the film formation condition, first, study of the film formation temperature is advanced, and it is found that the film formation temperature of 100 to 500 degrees C. is an optimum temperature range as a condition of being preferentially oriented in the (111) plane direction.

In addition, in order to enhance smoothness of the surface of the lower electrode layer 3 (the Pt film), Ti of 0.1 to several nm in thickness that has a smooth surface is formed so as to enhance homogeneity of a Ti layer that is the adhesion layer 2 to the substrate 1, and the lower electrode layer 3 (the Pt film) is formed in the upper part thereof, thereby the surface roughness of the lower electrode layer 3 (the Pt film) is reduced and controlled to several nm. Furthermore, the film thickness of the lower electrode layer 3 (the Pt film) is accurately controlled so as to reduce the surface asperity of the lower electrode layer 3 (the Pt film), thereby the lower electrode layer 3 (the Pt film) that is polycrystal is formed such that the size of the crystal particle is controlled so as to be homogeneous.

In addition, in order to more surely realize the optimum orientation domain component ratio of the lithium potassium sodium niobate film, it can be also adopted that the manufacturing conditions such as a film formation temperature, a kind of the sputtering operation gas, a pressure of the operation gas, a degree of vacuum, an input electric power, and a heat treatment after the film formation of the lithium potassium sodium niobate film itself that becomes the piezoelectric film 4 is adjusted and the optimization is carried out so as to obtain the crystal orientation that is capable of enhancing the piezoelectric property.

With regard to the above-mentioned conditions, the manufacturing conditions, an evaluation method and supervise method are studied strictly and in detail according to each device or various environments, thereby the lithium potassium sodium niobate film having pseudo-cubic crystal in which the c-axis orientation domain crystal component or the a-axis orientation domain crystal component exists or both of the domain crystal components coexist can be formed with high reproducibility.

In particular, in order to strictly control the orientation domain crystal component of each axis, the film formation temperature is accurately configured so as to be always constant, so that the (111) orientation component and the (001) orientation component fall within the range of a certain ratio. The film formation temperature is configured so as to fall within the temperature range that is capable of realizing the optimum orientation domain crystal component ratio by using heat conduction due to heat radiation by an infrared lamp or heater heating via a heat exchange plate as a heating device at the actual time of the film formation.

In addition, according to the above-mentioned conditions, a sputtering input electric power and a pressure and a flow volume of the gas introduced into the film formation device are determined to the optimum value, and an appropriate kind of the gas is selected, thereby an effect can be expected that various orientation domain crystal components including the (111) orientation and the (001) orientation as the crystal structure can be strictly controlled, and the lithium potassium sodium niobate film having a high piezoelectric constant can be obtained with stability and high reproducibility. Furthermore, a density of the sputtering target material is changed according to the above-mentioned condition, thereby the same effect can be also expected.

The upper electrode layer 5 is formed in the upper part of the piezoelectric film 4 that is formed on the substrate by carrying out the film formation within the range of the optimum condition as mentioned above, the piezoelectric element 10 having a high piezoelectric constant can be manufactured. In addition, the piezoelectric element 10 is formed so as to have a predetermined shape, and a voltage applying device or a voltage detecting device is installed, thereby various piezoelectric devices such as an actuator, a sensor can be manufactured.

Piezoelectric Device

Figure 9:
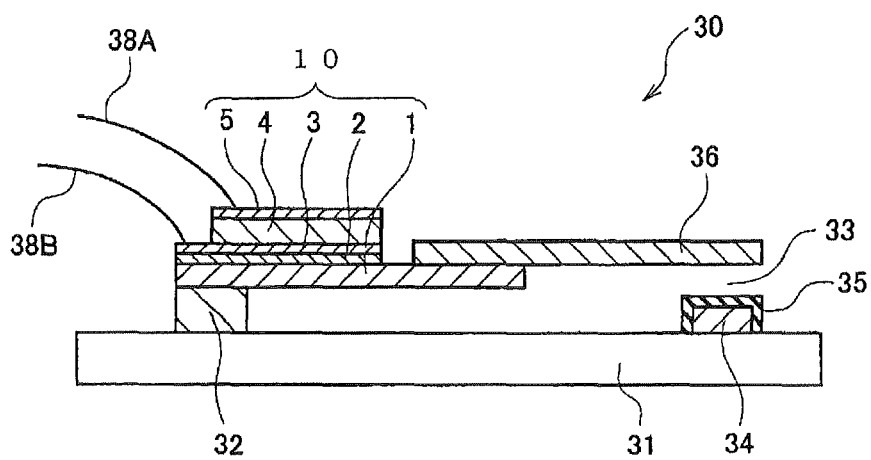
FIG. 9 is a cross-sectional view schematically showing a piezoelectric device according to an embodiment of the invention.

The piezoelectric element 10 according to the embodiment shown in FIG. 9 is formed so as to have a predetermined shape, and a voltage applying device or a voltage detecting device is installed between the lower electrode layer 3 and the upper electrode layer 5 of the piezoelectric element 10 formed, thereby various piezoelectric devices such as an actuator, a sensor can be manufactured. The crystal orientation of the lower electrode layer and the piezoelectric film in these devices is stably controlled, thereby enhancement of piezoelectric property and stabilization of the piezoelectric element and the piezoelectric device can be realized, and a micro device having a high performance can be provided at a low cost. In addition, the piezoelectric element according to the invention is a piezoelectric element including the piezoelectric film that is lead-free, thus the piezoelectric element according to the invention is mounted therein, thereby a small size system device, for example, a micro electro mechanical system (MEMS) device, such as a small size motor, sensor actuator that is capable of reducing environment load and has a high performance can be realized.

FIG. 9 is a cross-sectional view schematically showing a piezoelectric device according to an embodiment of the invention. The piezoelectric device 30 according to the embodiment shows a case that the piezoelectric element 10 according to the embodiment shown in FIG. 1 is applied to a variable capacitor. The piezoelectric device 30 includes a device substrate 31, an insulation layer 32 formed on the device substrate 31, and a piezoelectric element 10 formed on the insulation layer 32 and having a structure similar to that shown in FIG. 1. The device substrate 31 and the insulation layer 32 function as a supporting member that supports one end portion of the piezoelectric element 10. The piezoelectric film element 10 is configured such that the adhesion layer 2, the lower electrode 3 and the piezoelectric film 4 are formed on the substrate 1, and the substrate 1 is extended in another end portion (free end portion) of the piezoelectric element 10, and an upper capacitor electrode 36 is formed on the extending part of the substrate 1 so as to be projected. A lower capacitor electrode 34 is formed on the device substrate 31 so as to be located below the upper capacitor electrode 36 via a space 33, and an insulation layer 35 comprised of SiN or the like is formed on the surface of the lower capacitor electrode 34.

In addition, when electric voltage is applied to the upper electrode 5 and the lower electrode 3 via each of bonding wires 38A, 38B, the end portion of the piezoelectric element 10 is displaced, in association with this, the upper capacitor electrode 36 is displaced in the vertical direction. Due to the displacement of the upper capacitor electrode 36, the capacitor between the upper capacitor electrode 36 and the lower capacitor electrode 34 is changed, so that the piezoelectric device 30 operates as a variable capacitor.

A voltage applying device (not shown) is connected between the lower electrode layer 3 and the upper electrode 5 of the piezoelectric element 10 according to the embodiment, thereby an actuator as a piezoelectric device can be obtained. A voltage is applied to the piezoelectric element of the actuator so as to deform the piezoelectric element, thereby various members can be operated. The actuator can be used for, for example, an ink jetprinter, a scanner, an ultrasonic generator, and the like.

The piezoelectric element 10 according to the embodiment is formed so as to have a predetermined shape and the voltage applying device (not shown) is connected between the lower electrode layer 3 and the upper electrode 5, thereby a sensor as a piezoelectric device can be obtained. When the piezoelectric element of the sensor is deformed in association with change in some kind of physical quantity, a predetermined voltage occurs depending on the amount of displacement of the deformation, thus the voltage is detected by the voltage detecting device, thereby various physical quantities can be measured. The sensor includes a gyro sensor, an ultrasonic sensor, a pressure sensor, a velocity-acceleration sensor, and the like.

EXAMPLE

Example according to the invention will be explained below.

FIG. 1 is a cross-sectional view schematically showing the piezoelectric element 10 according to Example of the invention. In the Example, the piezoelectric element 10 was manufactured, the piezoelectric element 10 being configured such that the lower electrode layer 3 and the piezoelectric film 4 comprised of a perovskite type potassium sodium niobate (Hereafter referred to as "KNN") are formed in the upper part of the adhesion layer 2 formed on the Si substrate 1 having an oxide film. At this time, the piezoelectric film 4 has a crystal structure of pseudo-cubic crystal, tetragonal crystal, orthorhombic crystal, monoclinic crystal or rhombohedral crystal, or has a state that at least two of the crystal structures coexists as a crystal system, and the piezoelectric film 4 can have a composition of crystal or amorphia represented by a general formula of $ABO_3$, or the mixture of the crystal and the amorphia in at least a part thereof, wherein in the general formula, A represents at least one element selected from the group consisting of Li, Na, K, Pb, La, Sr, Nd, Ba and Bi, B represents at least one element selected from the group consisting of Zr, Ti, Mn, Mg, Nb, Sn, Sb, Ta and In, and O represents oxygen.

In addition, the lower electrode layer 3 can be comprised of a Pt alloy, or an alloy containing Ir or Ru. At the time, depending on the manufacturing condition, a state of the crystal orientation of the piezoelectric film is varied, so that the existence ratio of the crystallite component oriented along each crystal axis is varied.

First, a thermally-oxidized film was formed on the Si substrate 1, and the lower electrode layer 3 was formed thereon. At this time, the substrate 1 can be also comprised of a MgO substrate, a ZnO substrate, a $SrTiO_3$ substrate, a $SrRuO_3$ substrate, a glass substrate, a quartz glass substrate, a GaAs substrate substrate, a GaN, a Ge substrate, a sapphire substrate or a stainless substrate. The lower electrode layer 3 is comprised of a Ti film of 2 nm in thickness formed as the adhesion layer 2, and a Pt or Au thin film, or a lamination of both of the thin films, or a thin film of an alloy of Pt and Au, of 100 nm in thickness formed as an electrode layer. A sputtering method was used for forming the electrode layer. A metal target was used as the target for the sputtering, the sputtering input electric power at the film formation was 100 W, and as a sputtering gas, an Ar 100% gas, or an Ar and $O_2$ mixed gas, or at least one inert gas mixed gas, the inert gas being selected from the group consisting of He, Ne, Kr and $N_2$ gas.

Figure 2:
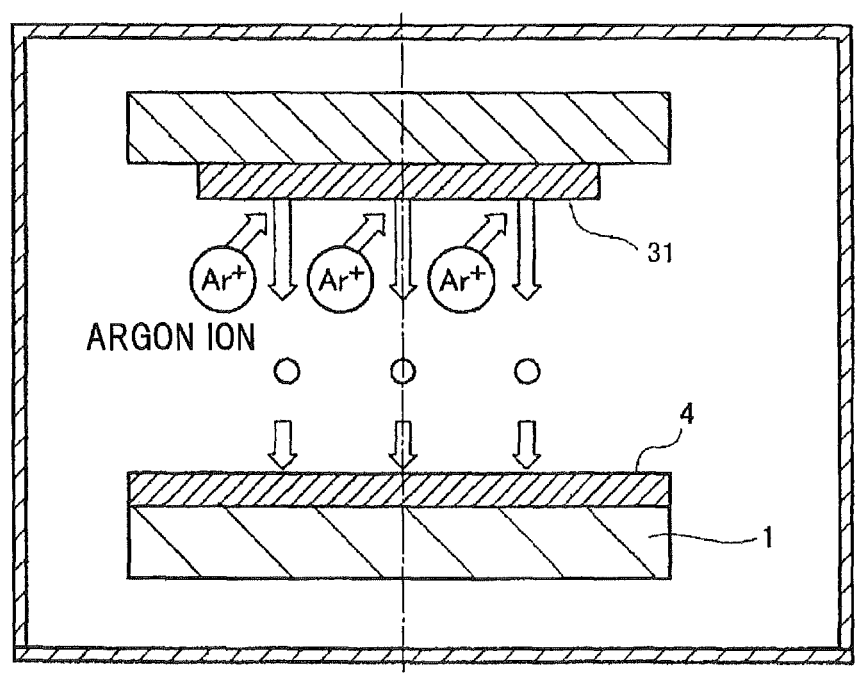
FIG. 2 is an explanatory view schematically showing a concept of a sputtering film forming method.

In addition, a polycrystalline thin film comprised of Pt or Au was formed at the substrate temperature of 350 degrees C. at the time of the film formation. Next, the KNN film was formed on the lower electrode layer 3 as the piezoelectric film 4. The sputtering method shown in FIG. 2 was also used for the film forming of the KNN film. At the time of forming the KNN film, the substrate was heated in a range of 400 to 500 degrees C., and the sputtering film formation was carried out by using a plasma due to an Ar and $O_2$ (5:5) mixed gas, or an Ar gas, or at least one inert gas mixed gas, the inert gas being selected from the group consisting of He, Ne, Kr and $N_2$ gas. In addition, as the target, a ceramic target comprised of $(Na_xK_yLi_z)NbO_3$ (x=0.5, y=0.5, Z=0) was used. The film formation was carried out until the film thickness became 3 μm. In addition, even after the film formation, heat treatment in $O_2$, in an inert gas, in an $O_2$ and inert gas mixed gas, in the air or in a vacuum was carried out.

Figure 3:
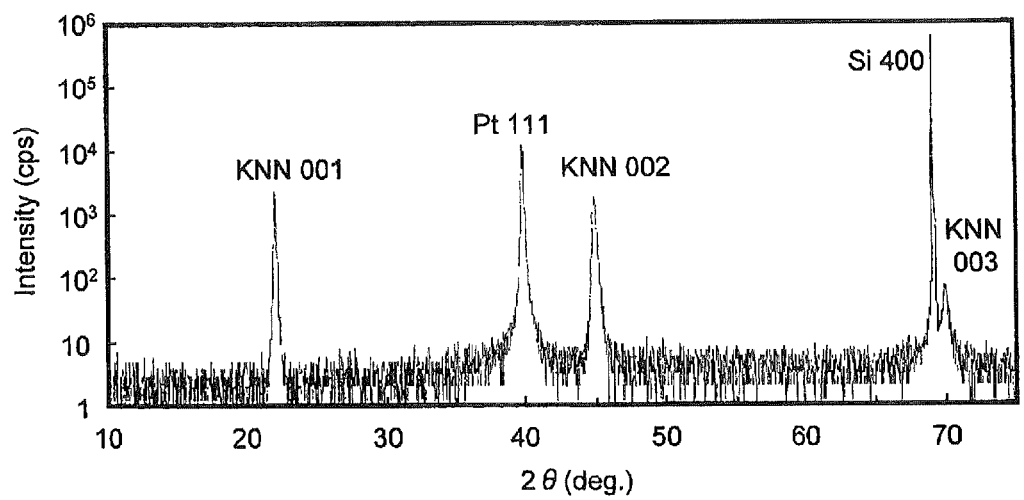
FIG. 3 is an example of an X-ray analysis pattern of $2\theta/\theta$ scan in the piezoelectric element according to Example of the invention.

With regard to the KNN film as the piezoelectric film 4 formed as mentioned above, the cross-sectional shape thereof was observed by using an electron scanning microscope or the like, as a result, it was found that the organization was configured to have a columnar structure, and the crystal structure was examined by using a general X-ray diffraction device, as a result, it was found that the Pt thin film described in Example formed by carrying out the substrate heating was a thin film formed so as to be oriented in the (111) plane direction and in a direction perpendicular to the surface of the substrate as shown in the X-ray diffraction pattern (2θ/θ scan measurement) of FIG. 3. The KNN film was formed on the Pt film preferentially oriented in the (111) plane direction, as a result, it was found that the KNN film formed was a polycrystalline thin film having a perovskite type crystal structure of pseudo-cubic crystal shown in FIG. 4.

In addition, as can be seen from the X-ray diffraction pattern of FIG. 3 measured in a wide diffraction range, only the diffraction peaks of 001, 002, 003 or 100, 200, 300 or a mixture thereof can be confirmed, thus the KNN film as the piezoelectric film 4 was preferentially oriented in a state of approximately (001) or (100) or a mixture thereof. In the structure analysis of the Example, "D8 DISCOVER with Hi STAR (registered trade mark)" manufactured by Bruker AXS was used.

Figure 5A:
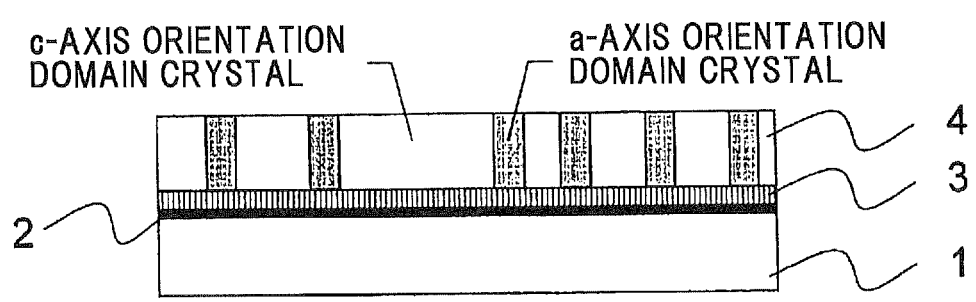
FIG. 5A is a cross-sectional view schematically showing the KNN piezoelectric film according to Example of the invention, that is in a state that c-axis orientation domain crystal component is large and a-axis orientation domain crystal component is small.
Figure 5B:
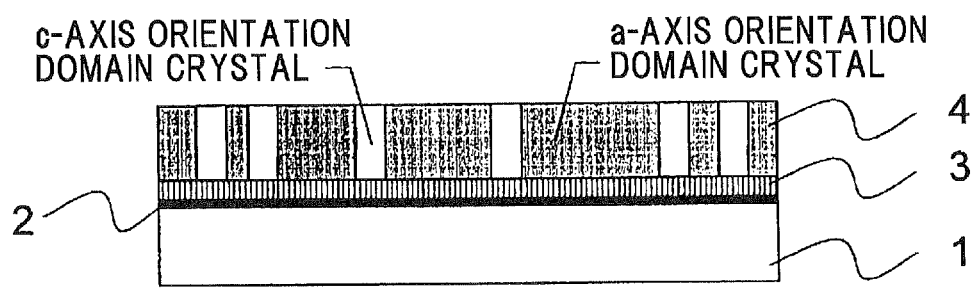
FIG. 5B is a cross-sectional view schematically showing the KNN piezoelectric film according to Example of the invention, that is in a state that the c-axis orientation domain crystal component is small and the a-axis orientation domain crystal component is large.

FIGS. 5A, 5B show a state that the domain crystals orientated along each crystal axis are mixed as a cross-sectional view. FIG. 5A shows a state that the c-axis orientation domain crystal component is larger than the a-axis orientation domain crystal component. On the other hand, FIG. 5B shows a state that the a-axis orientation domain crystal component is larger than the c-axis orientation domain crystal component. In the Example, the area in which both of the domain crystal components are in a state of being mixed is corresponding to an X-ray irradiation region of the X-ray diffraction device. In the X-ray diffraction analysis in the embodiment, 002 or 200 diffraction was measured by using an X-ray beam of 100 μm in diameter. The X-ray incident angle is approximately 45 degrees, thus an actual evaluation area of the domain crystal component becomes about 141 μm.

Figure 4:
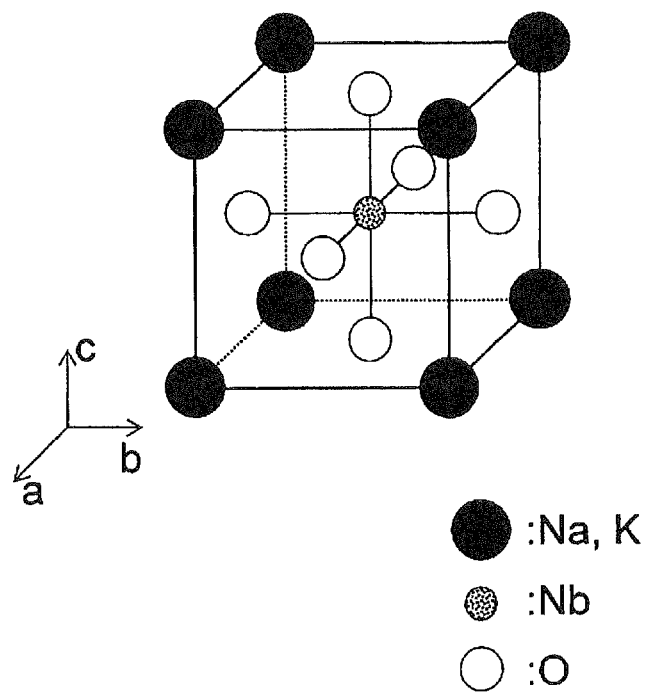
FIG. 4 is an explanatory view schematically showing a crystal structure of a KNN piezoelectric film according to Example of the invention.
Figure 6A:
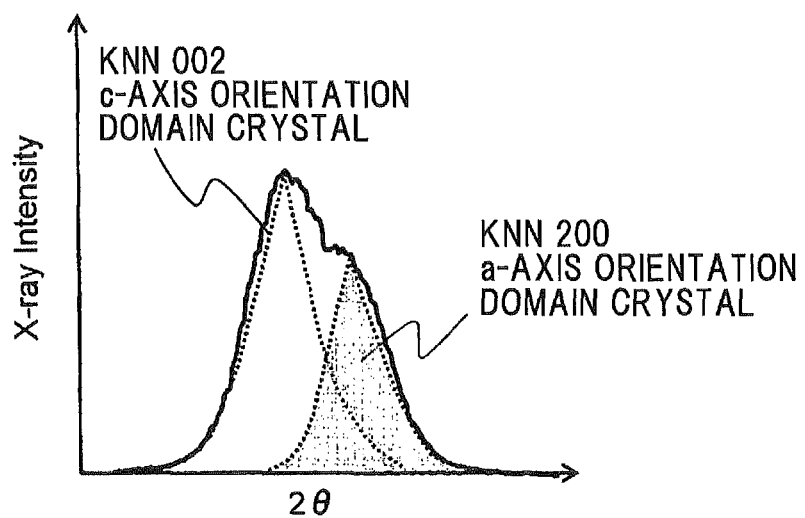
FIG. 6A is a cross-sectional view schematically showing an X-ray diffraction spectrum of 002 and 200 of the KNN piezoelectric film according to Example of the invention, that is in a state that the c-axis orientation domain crystal component is large and the a-axis orientation domain crystal component is small.
Figure 6B:
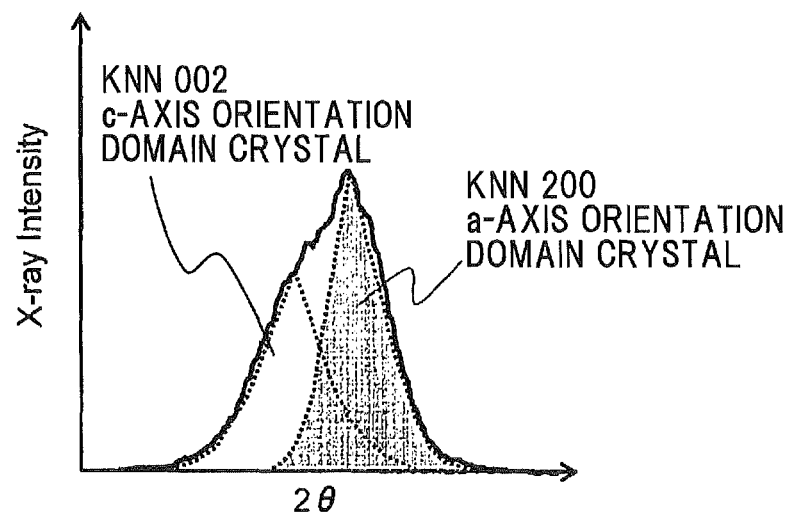
FIG. 6B is a cross-sectional view schematically showing an X-ray diffraction spectrum of 002 and 200 of the KNN piezoelectric film according to Example of the invention, that is in a state that the c-axis orientation domain crystal component is small and the a-axis orientation domain crystal component is large.

FIGS. 6A, 6B show a measurement result of 002 X-ray diffraction of the piezoelectric film 4 shown in FIG. 4 in Example. It can be seen that one diffraction pattern is formed by an overlap of the two X-ray diffractions. At this time, the spectrum peak of the high angle side in the diffraction angle of the horizontal axis is corresponding to the diffraction due to the a-axis orientation domain crystal component, and the spectrum peak of the low angle side in the diffraction angle of the horizontal axis is corresponding to the diffraction due to the c-axis orientation domain crystal component. In Miller indicex notation, each of them is described as 002, 200.

Figure 8:
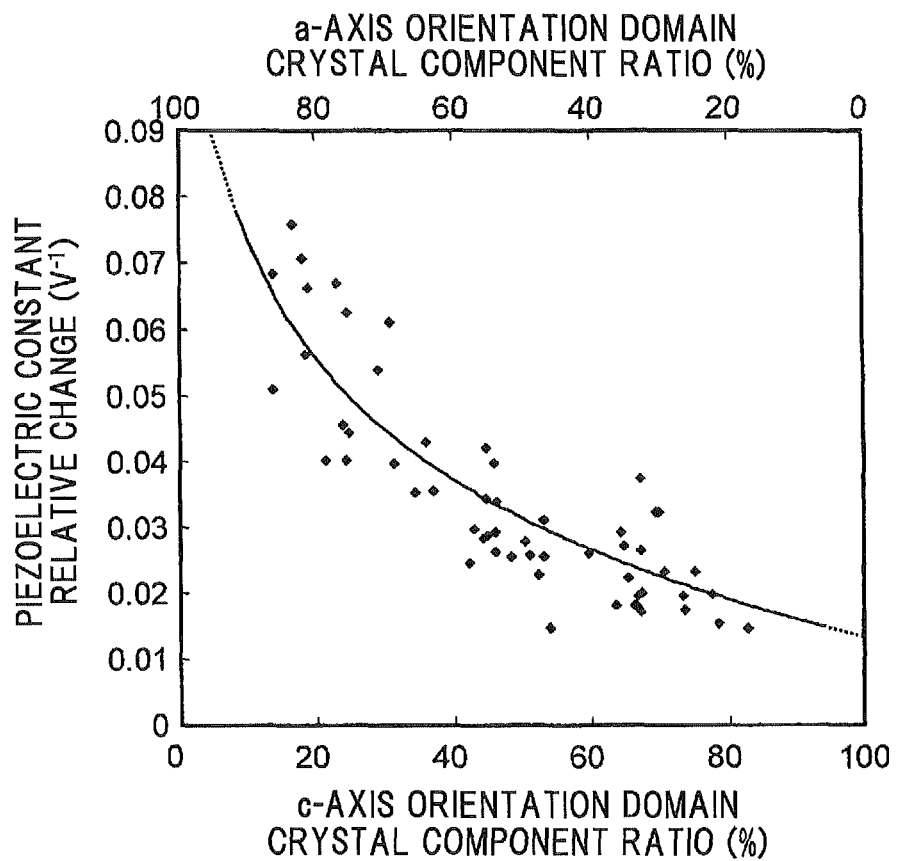
FIG. 8 is a graph showing a correlation between the a-axis and c-axis orientation domain crystal component ratios of the piezoelectric film, and a piezoelectric constant relative change in the piezoelectric element using the piezoelectric film according to Example of the invention.

FIG. 6A shows a state that the c-axis orientation domain crystal component is larger than the a-axis orientation domain crystal component. With regard to the X-ray diffraction spectrum shown in the drawing, an integration strength calculation is carried out as to each of the orientation domain components, thereby the domain component ratio between the c-axis orientation and the a-axis orientation can be estimated. The actual integration strength calculation was obtained by a spectrum fitting analysis using a distribution function such as Gauss function, Lorentz function, Pseudo Voight function that is a convolution function of Gauss function and Lorentz function, Pearson function and Split Pseudo Voight function. It was found that the a-axis orientation domain crystal component ratio is approximately 33% and the c-axis orientation domain crystal component ratio is approximately 67% led from the diffraction spectrum shown in FIG. 6A. The piezoelectric constant $d_{33}$ of the piezoelectric film 4 was 53 pm/V when the applied voltage is 2 V, and was 80.3 pm/V when the applied voltage is 30 V that is higher than 2 V. At this time, the voltage dependence of the piezoelectric constant that is shown in FIG. 8 as relative change was 0.017.

On the other hand, FIG. 6B shows a state that the a-axis orientation domain crystal component is larger than the c-axis orientation domain crystal component. At the time, the a-axis orientation domain crystal component ratio is approximately 55% and the c-axis orientation domain crystal component ratio is approximately 45% obtained from the integration strength calculation. The piezoelectric constant $d_{33}$ was 42.7 pm/V when the applied voltage is 2 V, and was 93.6 pm/V when the applied voltage is 30 V that is higher than 2 V. At this time, the relative change that is the voltage dependence of the piezoelectric constant was 0.040 (FIG. 8). Namely, in case of increase in the a-axis orientation domain crystal component, it is observed that the voltage dependence of the piezoelectric constant is large, and the piezoelectric constant in a high voltage is enhanced. This case is suitable for an actuator use in which wide operation range is required.

On the other hand, in case of increase in the c-axis orientation domain crystal component, increase in the piezoelectric constant in a low voltage is expected. This case has a merit that a high electric field can be obtained by a weak signal, in other words by a minute force, thus the case is suitable for a sensor application in which high sensitivity is required.

Figure 7:
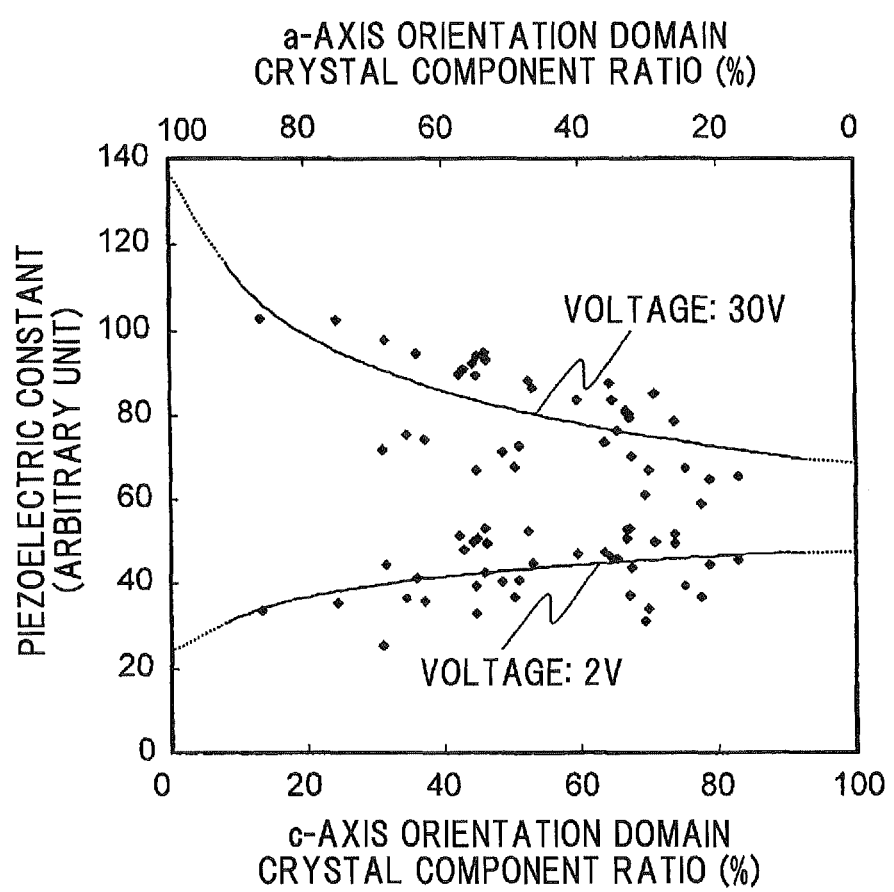
FIG. 7 is a graph showing a correlation between the a-axis and c-axis orientation domain crystal component ratios of the piezoelectric film, and a piezoelectric constant at the time of applying different voltages in the piezoelectric element using the piezoelectric film according to Example of the invention.

As the Example, FIG. 7 shows a change of the piezoelectric constant to the c-axis orientation domain crystal component or the a-axis orientation domain crystal component when a low voltage (2 V) and a high voltage (30 V) are applied. The lower horizontal axis shows the c-axis orientation domain crystal component ratio, the upper horizontal axis shows the a-axis orientation domain crystal component ratio, and the vertical axis shows the piezoelectric constant. Here, as an example, a piezoelectric constant obtained when voltage of 2 V or 30 V is applied is respectively shown. Further, the unit of the piezoelectric constant is arbitrary, but a particular example of the actual piezoelectric constant includes $d_{33}$ that is a change amount of expansion and contraction in a direction perpendicular to the electrode surface (in a direction of thickness), and $d_{31}$ that is a change amount of expansion and contraction in a direction along the electrode surface. As shown in FIG. 7, it can be seen that a tendency is shown that the more the c-axis orientation domain crystal component ratio is increased or the more the a-axis orientation domain crystal component ratio is decreased, the more the piezoelectric constant at the time of applying voltage of 2 V is increased.

On the other hand, a tendency is shown that the piezoelectric constant at the time of applying voltage of 30 V higher than 2 V is decreased. Namely, if the manufacturing is carried out while being controlled such that the c-axis orientation domain crystal component is increased, a piezoelectric element that exhibits a high piezoelectric constant in a low voltage can be realized. In addition, if the manufacturing is carried out while being controlled such that the a-axis orientation domain crystal component is increased, a piezoelectric element that exhibits a high piezoelectric constant in a high voltage can be realized.

Next, in order to study the voltage dependence of the piezoelectric constant, the relative change of the piezoelectric constant is examined throughout the voltage of 2 V to 30 V. FIG. 8 shows the study result. Here, in the Example, the relative change amount of the piezoelectric constant is defined as a standardized value ($R_d$) representing an amount of a piezoelectric constant change relative to a voltage change, as shown in the following formula, that is obtained by dividing a ratio ($\Delta d/\Delta V$) that is a ratio of a piezoelectric constant change ($\Delta d$) throughout 2 V to 30 V relative to a voltage change ($\Delta V$), by a piezoelectric constant ($d_0$) in a low voltage (2 V).

$$R_d = \frac{1}{d_0} \frac{\Delta d}{\Delta V}$$

$R_d$: an amount of a piezoelectric constant change relative to a voltage change
$d_0$: a piezoelectric constant in a low voltage (2 V)
$\Delta d$: a piezoelectric constant change
$\Delta V$: a voltage change As shown in FIG. 8, it can be seen that the more the c-axis orientation domain crystal component ratio is increased or the more the a-axis orientation domain crystal component ratio is decreased, the more the amount of the piezoelectric constant change relative to the voltage change is decreased. Namely, this shows that the more the c-axis orientation domain crystal component is increased, the smaller the voltage dependence of the piezoelectric constant becomes, so that the variation width of the piezoelectric property due to increase and decrease of the voltage can be prevented. In addition, it can be seen that the more the a-axis orientation domain crystal component is increased, the larger the voltage dependence of the piezoelectric constant becomes.

As shown in FIG. 7, according to the increase in the a-axis orientation domain crystal component, the increase in the piezoelectric displacement amount can be expected, but variation width relative to voltage is enlarged. It is considered that the above-mentioned case is suitable for a device such as an actuator required that the piezoelectric displacement amount is widely controlled according to largeness of the applied voltage.

As mentioned above, in the piezoelectric element that is comprised of a multilayered structure that includes a substrate, and at least a lower electrode layer, a piezoelectric film and an upper electrode layer successively formed on the substrate, the crystal orientation is accurately controlled such that the piezoelectric film has a crystal structure of pseudo-cubic crystal, tetragonal crystal, orthorhombic crystal, monoclinic crystal or rhombohedral crystal, or has a state that at least two of the crystal structures coexists, the piezoelectric film is preferentially oriented to certain specific axes that are not more than two axes of crystal axes in the crystal structures, and at least one of domain crystal component of a c-axis orientation domain crystal component and an a-axis orientation domain crystal component exists as the components of the crystal axes oriented, and preferably, a quantitative relation between the c-axis orientation domain crystal component and the a-axis orientation domain crystal component as the components of the oriented crystal axes of the piezoelectric film is configured such that, if the total component ratios of both of the components are defined as 100%, the component ratio of the c-axis orientation domain crystal component falls within the range of 10 to 90%, and the component ratio of the a-axis orientation domain crystal component falls within the range of 90 to 10%, thereby a piezoelectric element that has an excellent piezoelectric property and a high reliability can be provided. In addition, the domain crystal component ratio of the crystal axis of the piezoelectric film of the piezoelectric element is freely and accurately controlled, thereby a device including the piezoelectric element according to the invention can be provided as a piezoelectric device that has a property satisfying required performance.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A piezoelectric element, comprising:
a substrate; and
at least a lower electrode layer, a piezoelectric film represented by a general formula of $(Na_xK_yLi_z)NbO_3$ ($0 \leq x \leq 1$, $0 \leq y \leq 1$, $0 \leq z \leq 0.2$, $x+y+z=1$), and an upper electrode layer successively formed on the substrate,
wherein the piezoelectric film includes a crystal structure of a pseudo-cubic crystal, a tetragonal crystal, an orthorhombic crystal, a monoclinic crystal, or a rhombohedral crystal, or has a state that at least two of the crystal structures coexist,
wherein the piezoelectric film is preferentially oriented to two crystal axes in the crystal structures, and
wherein components of crystal axes oriented of the piezoelectric film consist essentially of a c-axis orientation domain crystal component and an a-axis orientation domain crystal component.

2. The piezoelectric element according to claim 1, wherein a quantitative relationship between the c-axis orientation domain crystal component and the a-axis orientation domain crystal component as the components of the oriented crystal axes of the piezoelectric film is configured such that, if total component ratios of both of the components are defined as 100%, the component ratio of the c-axis orientation domain crystal component falls within a range of 10 to 90%, and the component ratio of the a-axis orientation domain crystal component falls within the range of 90 to 10%.

3. The piezoelectric element according to claim 1, wherein the piezoelectric film includes an aggregate structure comprising particles including a columnar structure.

4. The piezoelectric element according to claim 1, wherein the piezoelectric film comprises a crystal or an amorphia represented by a general formula of $ABO_3$, or a mixture of the crystal and the amorphia in at least a part thereof, where A represents at least one element selected from the group consisting of Li, Na, K, Pb, La, Sr, Nd, Ba, and Bi, and B represents at least one element selected from the group consisting of Zr, Ti, Mn, Mg, Nb, Sn, Sb, Ta, and In, and O represents oxygen.

5. The piezoelectric element according to claim 1, wherein the lower electrode layer comprises an electrode layer comprising Pt or an alloy containing Pt as a main component, or an electrode layer comprising a multilayer structure including a layer comprising Pt as a main component.

6. The piezoelectric element according to claim 1, wherein the lower electrode layer comprises an electrode layer comprising a multilayer structure including a layer comprising at least one element selected from the group consisting of Ru, Ir, Sn, and In, an oxide of the elements, or a compound between elements contained in the piezoelectric film and elements of Ru, Ir, Sn, and In.

7. The piezoelectric element according to claim 1, wherein the upper electrode layer comprises an electrode layer comprising Pt or an alloy containing Pt as a main component, or an electrode layer comprising a multilayer structure including a layer comprising Pt as a main component.

8. The piezoelectric element according to claim 1, wherein the upper electrode layer comprises a multilayer structure including a layer comprising at least one element selected from the group consisting of Ru, Ir, Sn, and In, an oxide of the elements, or a compound between elements contained in the piezoelectric film and elements of Ru, Ir, Sn, and In.

9. The piezoelectric element according to claim 1, wherein the lower electrode layer comprises a single layer structure or a multilayer structure, and the lower electrode layer is preferentially oriented in a direction perpendicular to a surface of the substrate in the crystal orientation.

10. The piezoelectric element according to claim 1, wherein the substrate comprises a crystal or an amorphia of Si, MgO, ZnO, $SrTiO_3$, $SrRuO_3$, glass, quartz glass, GaAs, GaN, sapphire, Ge, or stainless, or a composite thereof.

11. A piezoelectric device, comprising:
the piezoelectric element according to claim 1; and
a voltage detecting device connected between the lower electrode layer and the upper electrode layer of the piezoelectric element,
wherein the c-axis orientation domain crystal component is more than the a-axis orientation domain crystal component.

12. A sensor, comprising:
the piezoelectric device according to claim 11.

13. A piezoelectric device, comprising:
the piezoelectric element according to claim 1; and
a voltage applying device connected between the lower electrode layer and the upper electrode layer of the piezoelectric element,
wherein the a-axis orientation domain crystal component is more than the c-axis orientation domain crystal component.

14. An actuator, comprising:
the piezoelectric device according to claim 13.

15. The piezoelectric element according to claim 1, wherein the piezoelectric film has the state that the at least two of the crystal structures coexist.

16. The piezoelectric element according to claim 1, wherein the a-axis orientation domain crystal component is more than the c-axis orientation domain crystal component.

17. The piezoelectric element according to claim 1, wherein the c-axis orientation domain crystal component is more than the a-axis orientation domain crystal component.

18. A piezoelectric device, comprising:
the piezoelectric element according to claim 1,
wherein the c-axis orientation domain crystal component is more than the a-axis orientation domain crystal component.

19. A piezoelectric device, comprising:
the piezoelectric element according to claim 1,
wherein the a-axis orientation domain crystal component is more than the c-axis orientation domain crystal component.

* * * * *